(12) United States Patent
Koizumi

(10) Patent No.: US 8,220,621 B2
(45) Date of Patent: Jul. 17, 2012

(54) IC DEVICE CONVEYING APPARATUS

(75) Inventor: Mitsuo Koizumi, Fukushima (JP)

(73) Assignee: Synax Co., Ltd., Matsumoto-shi, Nagano-ken (JP)

( * ) Notice: Subject to any disclaimer, the term of this patent is extended or adjusted under 35 U.S.C. 154(b) by 312 days.

(21) Appl. No.: 12/724,545

(22) Filed: Mar. 16, 2010

(65) Prior Publication Data

US 2011/0226587 A1 Sep. 22, 2011

(51) Int. Cl.
*B65G 47/74* (2006.01)

(52) U.S. Cl. ........... 198/867.08; 198/803.11; 198/803.9; 198/867.07; 198/465.2

(58) Field of Classification Search ............... 198/345.2, 198/465.2, 468.2, 470.1, 473.1, 867.02, 867.07, 198/867.08, 803.11, 803.9
See application file for complete search history.

(56) References Cited

U.S. PATENT DOCUMENTS

| | | | | |
|---|---|---|---|---|
| 4,488,633 A * | 12/1984 | Kampf | | 198/341.08 |
| 5,244,082 A * | 9/1993 | Togashi | | 198/867.08 |
| 5,348,142 A * | 9/1994 | Nishimura et al. | | 198/867.08 |
| 5,438,740 A * | 8/1995 | Carr et al. | | 29/33 P |
| 5,474,166 A * | 12/1995 | Santandrea et al. | | 198/345.3 |
| 6,286,661 B1 * | 9/2001 | Galassi et al. | | 198/803.11 |
| 6,374,997 B1 * | 4/2002 | Spadafora et al. | | 198/803.11 |
| 7,572,123 B2 * | 8/2009 | Barker et al. | | 425/392 |
| 7,621,109 B2 * | 11/2009 | Momich | | 53/473 |
| 8,079,460 B2 * | 12/2011 | Kurz et al. | | 198/473.1 |
| 2002/0005336 A1 * | 1/2002 | Rehm | | 198/803.11 |

* cited by examiner

*Primary Examiner* — Mark A Deuble
(74) *Attorney, Agent, or Firm* — Nixon & Vanderhye P.C.

(57) ABSTRACT

An IC device conveying apparatus includes an IC device conveying shuttle, at least a pair of slide guide plates which are placed on the IC device conveying shuttle, and each of which has a plurality of slide guide holes, each of the plurality of slide guide holes being made in a direction inclined to a side of a corresponding slide guide plate, and a plurality of positioning members which guide the placed pair of slide guide plates such that the pair of slide guide plates slides in directions in which sides of the respective slide guide plates are separated from and come into contact with each other, the positioning members being secured to the IC device conveying shuttle and engaged with the plurality of slide guide holes, wherein each of the pair of slide guide plates comprises at least one IC device holding side on a side thereof facing a side of another slide guide plate, and an IC device is placed in an IC device holding space which is formed between at least a pair of the IC device holding sides of the pair of slide guide plates on a top surface of the IC device conveying shuttle, and is held between the pair of the IC device holding sides.

4 Claims, 4 Drawing Sheets

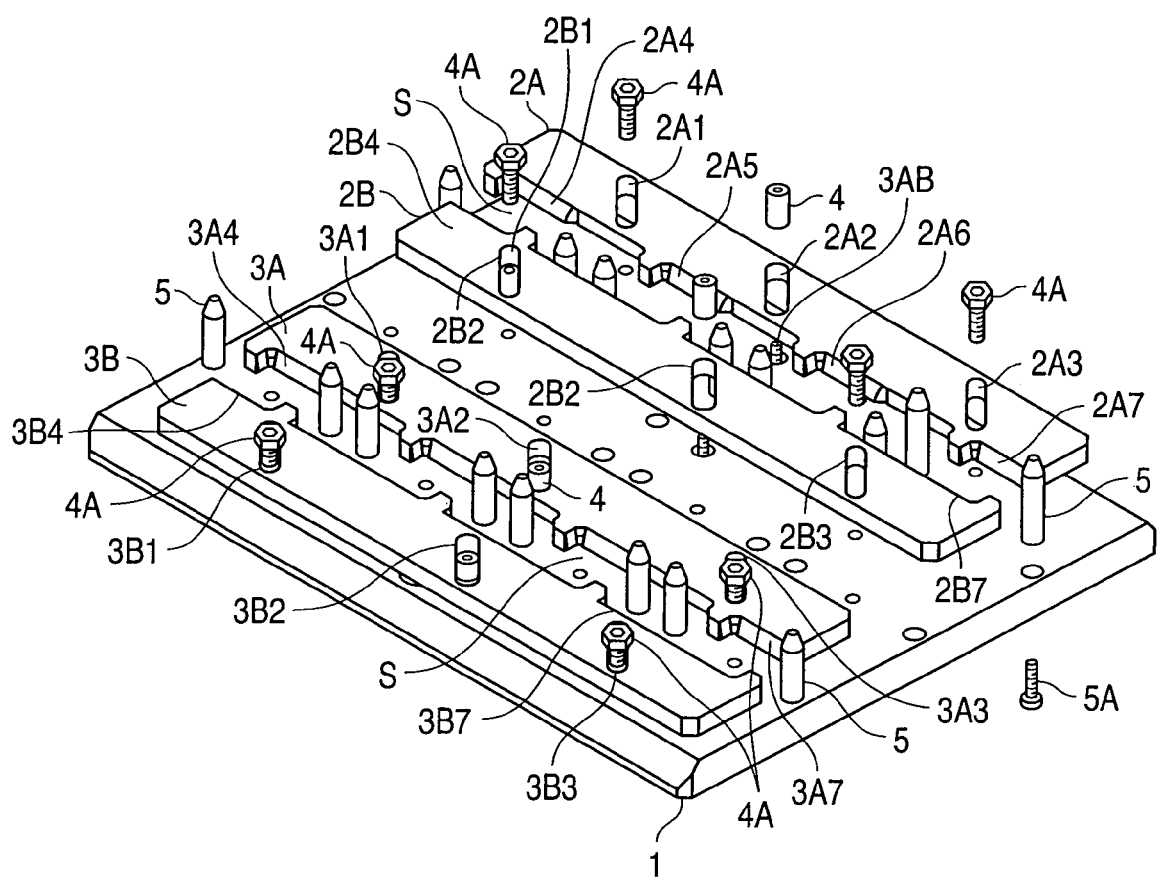
F I G. 1

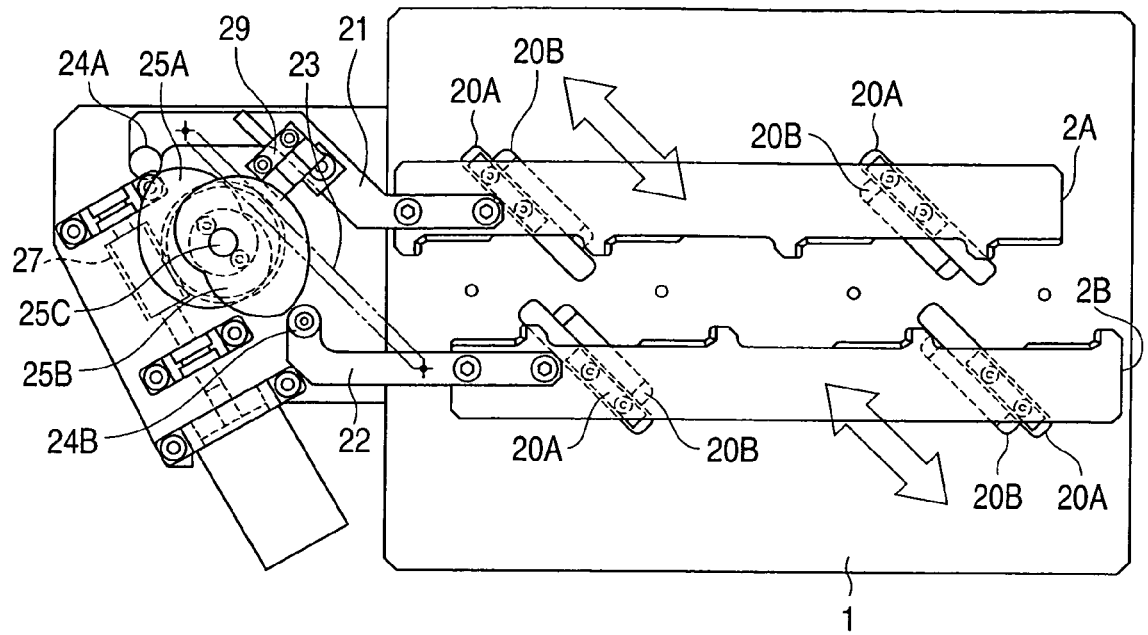
F I G. 4
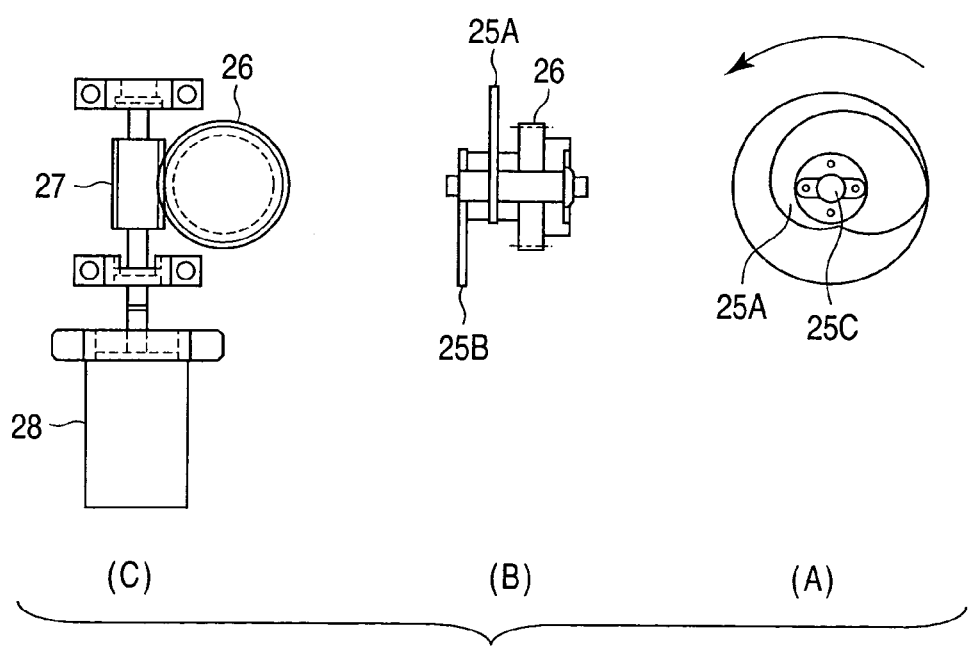
(C)  (B)  (A)
F I G. 5

IC DEVICE CONVEYING APPARATUS

BACKGROUND OF THE INVENTION

1. Field of the Invention

The present invention relates to an IC handler, and more particularly to an IC device conveying apparatus.

2. Description of the Related Art

Conventionally, an IC handler is used in association with, for example, an IC device conveying apparatus which is used when an IC device to be tested is sequentially taken out from a location where manufactured IC devices are collected, and a single or a plurality of IC devices are sent to an IC tester for testing.

A conventional IC device conveying apparatus is configured as a shuttle table. In order to precisely convey a single or a plurality of IC devices placed on the shuttle table to a testing position in a subsequent process, the IC device(s) needs to be held precisely in a predetermined position on the shuttle table. For this purpose, an IC device holding apparatus is used.

For a conventional IC device holding apparatus, for example, an IC device holder is used having an IC device receiving portion in which an excavated pocket is formed in a surface of a shuttle table in accordance with the shape of an IC device or an excavated pocket is formed in the surface of the shuttle table in accordance with the shape of a guide part which holds an IC device and an IC device is inserted in and secured to the excavated pocket.

Many of IC devices to be tested have a square or rectangular outer shape but IC devices have diverse types and diverse outer dimensions. Thus, in a conventional shuttle table, there is a need to individually form an excavated pocket having dimensions that can accept an IC device holder having a receiving portion which is formed in accordance with the outer dimensions of an IC device to be tested, and prepare in advance a plurality of such pockets as change kits for respective IC devices having different outer dimensions. Accordingly, it takes a lot of cost to produce change kits and also it takes a lot of trouble to change a change kit.

BRIEF SUMMARY OF THE INVENTION

As described above, in a conventional shuttle table, there is a need to prepare in advance change kits for respective IC devices having different outer dimensions. Accordingly, there are problems in that it takes a lot of cost to produce change kits and also it takes a lot of trouble to change a change kit.

To solve the problems, the present invention provides an IC device conveying apparatus configured to universally handle various IC devices without using change kits.

In view of the above-described problems, an object of the present invention is therefore to provide an IC device conveying apparatus which can convey IC devices to a next process easily and precisely and at low cost.

The present invention provides an IC device conveying apparatus comprising:

an IC device conveying shuttle;

at least a pair of slide guide plates which are placed on the IC device conveying shuttle, and each of which has a plurality of slide guide holes, each of said plurality of slide guide holes being made in a direction inclined to a side of a corresponding slide guide plate; and a plurality of holding pins which hold the placed pair of slide guide plates such that the pair of slide guide plates slides in directions in which sides of the respective slide guide plates are separated from and come into contact with each other, the holding pins being secured to the IC device conveying shuttle and engaged with said plurality of slide guide holes, wherein each of the pair of slide guide plates comprises at least one IC device holding side on a side thereof facing a side of another slide guide plate; and an IC device is placed in an IC device holding space which is formed between a pair of the IC device holding sides of the pair of slide guide plates on a top surface of the IC device conveying shuttle, and is held between the pair of the IC device holding sides.

According to the invention, an IC device conveying apparatus can be provided which can hold an IC device irrespective of the outer dimensions of the IC device, without changing a holding part such as a change kit, and can reduce IC handling cost, and can easily and precisely convey the IC device to a next process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view showing a configuration of an IC device conveying apparatus according to an embodiment of the present invention;

FIG. 4 is a plan view showing a configuration of an IC device conveying apparatus according to another embodiment of the present invention;

FIG. 5 is a plan view showing cams and a driving unit for the cams which are shown in FIG. 4.

DETAILED DESCRIPTION OF THE INVENTION

FIG. 1 is a perspective view showing an overall configuration of an IC device conveying apparatus according to a first embodiment of the present invention. The IC device conveying apparatus comprises, as principal components, a shuttle 1 which is a substrate of the conveying apparatus; and two pairs of slide guide plates 2A, 2B, 3A, and 3B which are placed on the shuttle 1.

The slide guide plate 2A comprises three slide holes 2A1, 2A2, and 2A3 having an oblique angle of about 45 degrees, for example, with respect to a linear outer side thereof. Likewise, other slide guide plates 2B, 3A, and 3B also comprise three slide holes 2B1, 2B2, and 2B3, 3A1, 3A2, and 3A3, and 3B1, 3B2, and 3B3 formed therein, respectively.

A guide pin 4 is inserted into the slide hole 2A2 and secured by a bolt 3AB to a top surface of the shuttle 1. Bolts 4A are respectively screwed into the slide holes 2A1 and 2A3 provided at both ends. The heads of the bolts 4A are formed to be larger than the width of the slide holes 2A1 and 2A3. Thus, the position of the slide guide plate 2A is controlled by the guide pin 4 and the bolts 4A being loosened. With the bolts 4A being loosened, the slide guide plate 2A is controlled by the guide pin 4 to slide along the slide hole 2A2. As a result, the slide guide plate 2A can freely move on the surface of the shuttle 1 in parallel along the slide holes 2A1, 2A2, and 2A3. Other slide guide plates 2B, 3A, and 3B are also similarly formed so as to freely move on the surface of the shuttle 1 in parallel along the slide holes 2B1, 2B2, and 2B3, 3A1, 3A2, and 3A3, and 3B1, 3B2, and 3B3, by their respective guide pins 4 and bolts 4A being loosened.

A plurality of guide pins 5 are further mounted on the shuttle 1 and are screwed with cap screws 5A from the back side of the shuttle 1. The guide pins 5 are used, for example, to perform positioning when a robot arm picks up an IC device conveyed while being placed on the shuttle 1, in a testing process performed later on. The guide pins 5 are not directly related to the present invention and thus further description thereof is omitted.

The slide guide plate 2A has four IC device holding sides 2A4 to 2A7 formed on a side thereof. The slide guide plate 2B facing the slide guide plate 2A also has four IC device holding sides 2B4 to 2B7 on a side thereof. Likewise, other slide guide plates 3A and 3B also respectively have four IC device holding sides 3A4 to 3A7 and 3B4 to 3B7 formed on sides thereof facing each other. Thus, four IC device holding spaces S are formed between the pair of slide guide plates 2A and 2B and between the pair of slide guide plates 3A and 3B.

Figure 2:
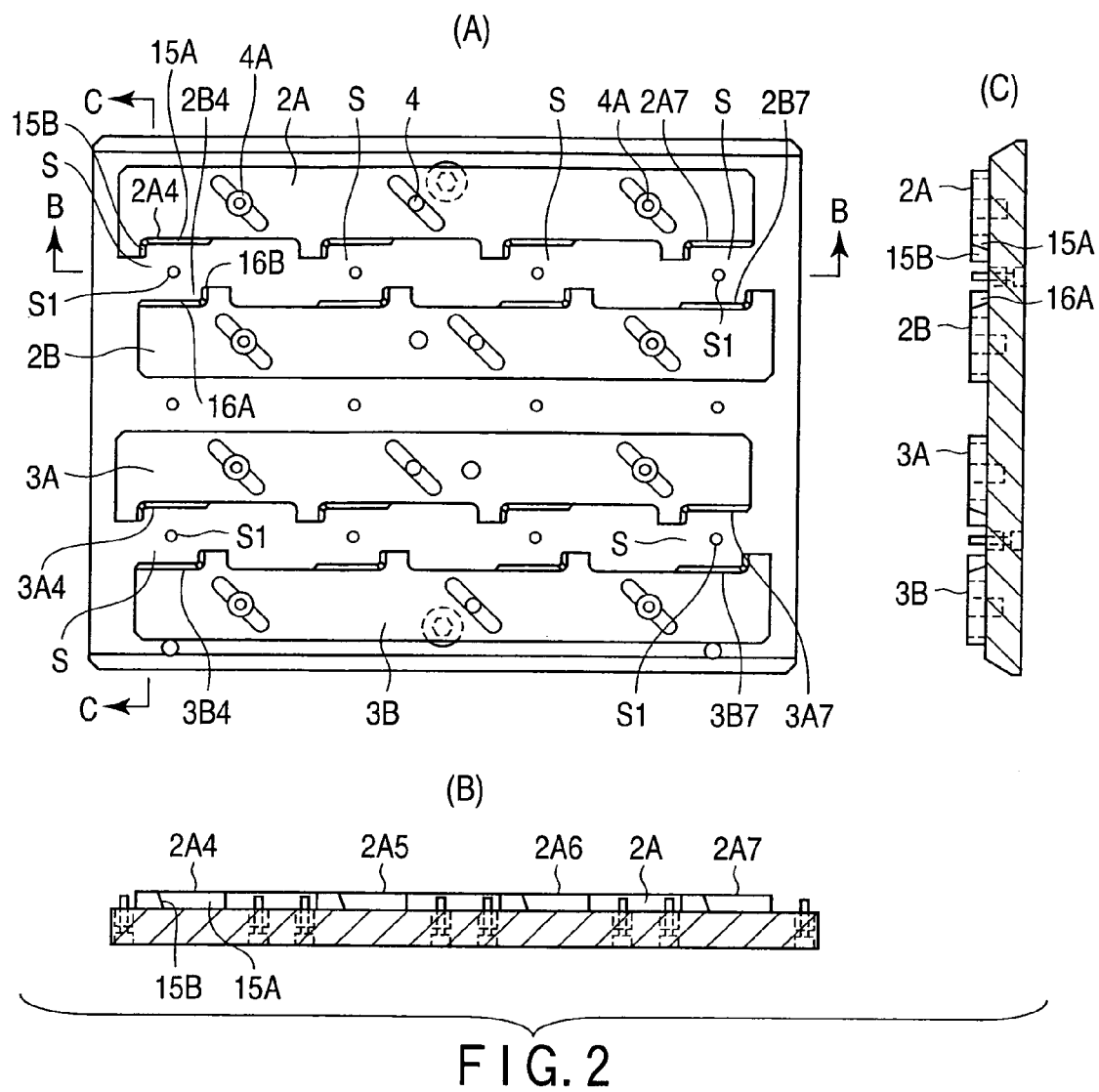
FIG. 2 is a diagram showing the configuration of the IC device conveying apparatus shown in FIG. 1.

(A) in FIG. 2 is a top view of the slide guide plates 2A, 2B, 3A, and 3B being mounted on the shuttle 1 shown in FIG. 1. The slide guide plate 2A moves on the surface of the shuttle 1 in parallel along the slide holes 2A1, 2A2, and 2A3 by the guide pin 4 and the bolts 4A. (A) in FIG. 2 shows a state in which the slide guide plate 2A is located in a position that is substantially in the middle of a movable range which is controlled by the slide holes 2A1, 2A2, and 2A3. Likewise, other slide guide plates 2B, 3A, and 3B also move on the surface of the shuttle 1 by their respective guide pins 4 and bolts 4A. (A) in FIG. 2 shows a state in which each of the slide guide plates 2B, 3A, and 3B is located in a position that is substantially in the middle of a movable range thereof.

As described in FIG. 1, the slide guide plate 2A has the four IC device holding sides 2A4 to 2A7 formed at regular intervals on a side thereof. The slide guide plate 2B facing the side of the slide guide plate 2A also has the four IC device holding sides 2B4 to 2B7 formed at regular intervals on a side thereof. The four IC device holding spaces S are formed between the slide guide plates 2A and 2B. Other slide guide plates 3A and 3B also respectively have the four IC device holding sides 3A4 to 3B7 and 3B4 to 3B7 formed at regular intervals on sides thereof facing each other, and the four IC device holding spaces S are formed between the slide guide plates 3A and 3B.

In a portion of the surface of the shuttle 1 exposed in the IC device holding spaces S, insertion holes S1 for IC device holding jigs are made in precise positions.

Figure 3:
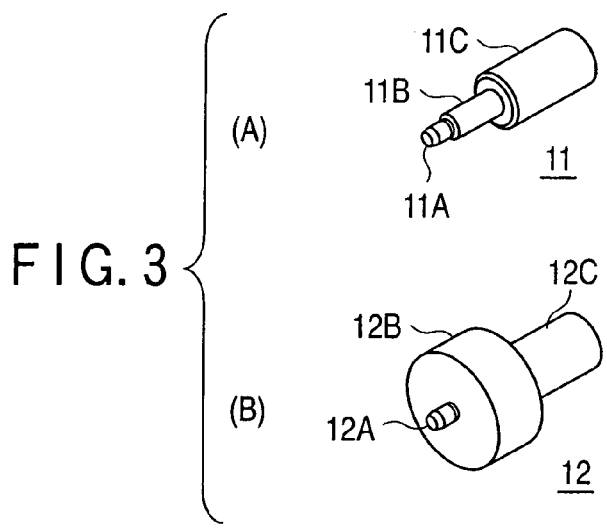
FIG. 3 is a perspective view showing examples of jigs used for positioning of slide guide plates for IC devices which are used in the IC device conveying apparatus according to the embodiment shown in FIGS. 1 and 2.

The IC device holding jigs have shapes, for example, shown in (A) and (B) in FIG. 3. A jig 11 in (A) in FIG. 3 is configured to comprise an insertion end 11A which is inserted into a jig insertion hole S1, and comprise a cylindrical IC device holding portion 11B adjacent to the insertion end 11A, and a knob portion 11C. A jig 12 in (B) in FIG. 3 is configured to comprise an insertion end 12A which is inserted into an insertion hole S1, and comprise a cylindrical IC device holding portion 12B adjacent to the insertion end 12A, and a knob portion 12C. The IC device positioning portions 11B and 12B can take various configurations and shapes, according to the shapes of IC devices to be held.

(B) in FIG. 2 is a cross-sectional view of the shuttle 1 taken along line B-B of (A) in FIG. 2 and viewed in a direction of arrows B-B, to show the side shapes of the IC device holding sides 2A4 to 2A7 formed on a side of the slide guide plate 2A. Similarly, (C) in FIG. 2 is a cross-sectional view of the shuttle 1 taken along line C-C of (A) in FIG. 2 and viewed in a direction of arrows C-C, to show the side shapes of the IC device holding sides 2A4 to 3B4 in a longitudinal direction of the slide guide plates 2A, 2B, 3A, and 3B.

In (C) in FIG. 2, the IC device holding side 2A4 of the slide guide plate 2A has an L shape formed by a first holding surface 15A which is formed in a longitudinal direction thereof, and a second holding surface 15B which is formed in a direction orthogonal to the longitudinal direction. As shown in (B) in FIG. 2, the second holding surface 15B also has an inclined surface formed inclined to the surface of the shuttle 1. As shown in (C) in FIG. 2, the first holding surface 15A also has an inclined surface formed inclined to the surface of the shuttle 1. Each of other IC device holding sides 2A5 to 2A7 of the slide guide plate 2A also has two inclined surfaces which are formed in directions orthogonal to each other and in the same manner as above.

The slide guide plate 2B facing the slide guide plate 2A also has the IC device holding sides 2B4 to 2B7 formed in the same manner as above. For example, the IC device holding side 2B4 has, as shown in (A) in FIG. 2, an inverted L shape formed by a first holding surface 16A which is formed to face the first holding surface 15A formed on the IC device holding side 2A4 of the slide guide plate 2A, and a second holding surface 16B which is formed to face the second holding surface 15B. Each of other IC device holding sides 2B5 to 2B7 of the slide guide plate 2B also has an inverted L shape formed by two inclined surfaces which are formed in directions orthogonal to each other and in the same manner as the holding side 2B4.

The other pair of slide guide plates 3A and 3B also have the IC device holding sides 3A4 to 3A7 and 3B4 to 2B7 formed on sides thereof facing each other, in the same manner as above.

In this state, for example, an operator moves the slide guide plate 2A in a direction approaching the slide guide plate 2B on the surface of the shuttle 1 in parallel along the slide holes 2A1, 2A2, and 2A3, with the slide guide plate 2A being controlled by the guide pin 4 and the loosened bolts 4A. As a result, the first holding surface 15A of the IC device holding side 2A4 formed on the side of the slide guide plate 2A comes into contact with, for example, a positioning portion 11B of a jig 11. The IC device holding side 2A4 is formed such that, at this time, the second holding surface 15B formed in the direction orthogonal to the direction of the first holding surface 15A also comes into contact with the positioning portion 11B of the jig 11 at the same time. For example, when the slide holes 2A1, 2A2, and 2A3 are made at an angle of 45 degrees with respect to the longitudinal direction of the slide plate 2A, the IC device holding side 2A4 is formed such that the first holding surface 15A and the second holding surface 15B have substantially equal distances to a side of the positioning portion 11B of the jig 11 which is secured in the center of the IC device holding space S. At the same time, other IC device holding sides 2A5 to 2A7 formed on the side of the slide guide plate 2A also come into contact with jigs 11 in their corresponding holding spaces. By the operator tightening the two bolts 4A in this state, the slide guide plate 2A is secured in that position.

Meanwhile, the slide guide plate 2B is caused to move in a direction approaching the slide guide plate 2A on the surface of the shuttle 1 in parallel along the slide holes 2B1, 2B2, and 2B3, by the guide pin 4 and the loosened bolts 4A. As a result, first holding surfaces 16A and 16B of the respective IC device holding sides 2B4 to 2B7 formed on the side of the slide guide plate 2B also stop in positions in which the first and second holding surfaces 16A and 16B come into contact with their corresponding jigs 11. Then, the slide guide plate 2B is secured in the same manner as above by the bolts 4A.

Likewise, the other pair of slide guide plates 3A and 3B also stop and are secured in positions in which the slide guide plates 3A and 3B come into contact with jigs which hold IC devices. When the securing is done, the jigs 11 are removed, forming holding spaces S. When jigs 12 are used, too, the slide guide plates 2A and 2B are positioned and secured in the same manner as above.

As such, even when the dimensions of IC devices to be tested are changed, only by replacing, if necessary, jigs 11 with jigs 12, for example, the changed dimensions can be handled without changing the slide guide plates 2A, 2B, 3A, and 3B. Accordingly, an IC device conveying apparatus can be provided that can reduce the cost and trouble of the IC device conveying apparatus and can easily and precisely convey IC devices to a next process.

Although, in the embodiment shown in FIGS. 1 to 3, the case has been described in which the operator slides and secures the slide guide plates 2A, 2B, 3A, and 3B on the surface of the shuttle 1 by hand, the slide guide plates 2A, 2B, 3A, and 3B may be moved using a stepper motor, instead of the operator sliding the slide guide plates 2A, 2B, 3A, and 3B by hand.

A second embodiment will be described below with reference to FIGS. 4 to 6.

In FIG. 4, a pair of slide guide plates 2A and 2B are slidably mounted on a top surface of a shuttle 1 in the same manner as in the first embodiment. In the second embodiment, pairs of linear guide bars 20A and 20B are configured to be secured to the slide guide plate 2A and the shuttle 1, respectively, instead of slide holes, a guide pin, and bolts, and to slide in the same direction as the slide holes. Likewise, pairs of linear guide bars 20A and 20B are secured to the other slide guide plate 2B and the shuttle 1, respectively. FIG. 4 shows a state in which the slide guide plates 2A and 2B are farthest away from each other.

An operating arm 21 is secured to one end of the slide guide plate 2A and an operating arm 22 is secured to one end of the other slide guide plate 2B. One operating arm 22 is urged to be always pulled, by an extension spring 23, in a direction toward the guide plate 2A facing the slide guide plate 2B, along the pairs of linear guide bars 20A and 20B. In contrast, the operating arm 21 secured to the one end of the slide guide plate 2A is urged to be always pulled, by the same extension spring 23, in a direction toward the guide plate 2B facing the slide guide plate 2A, along the pairs of linear guide bars 20A and 20B.

Cam rollers 24A and 24B are rotatably secured to the respective ends of the operating arms 21 and 22. The cam rollers 24A and 24B are pressed against the operating surfaces of their respective special cams 25A and 25B by the tension of the extension spring 23. Thus, when the cams 25A and 25B rotate, the positions of the cam rollers 24A and 24B move according to the rotation. According to the movement, the operating arms 21 and 22 are driven to slide the slide guide plates 2A and 2B such that the slide guide plates 2A and 2B simultaneously move in parallel along the linear guide bars 20A and 20B in directions in which they are separated from and come into contact with each other.

As shown in (A) in FIG. 5, one cam 25A rotates about a camshaft 25C. According to the rotation, the distance from the camshaft 25C to the cam operating surface changes between a minimum position and a maximum position. Thus, the position of the cam roller 24A also changes. The other cam 25B is formed such that the cam roller 24B is separated from and comes into contact with the cam roller 24A in synchronization with the cam roller 24A and in an opposite direction to that of the cam roller 24A between the minimum and maximum positions thereof, according to the rotation of the cam 25B. In this manner, the slide guide plates 2A and 2B slide so as to be separated from and come into contact with each other in synchronization with each other.

The camshaft 25A has, as shown in (B) in FIG. 5, the cams 25A and 25B secured thereto and has, as shown in (C) in FIG. 5, a cam rotation wheel 26 secured thereto. A worm gear 27 meshes with the wheel 26 and a stepper motor 28 is coupled to a rotating shaft of the worm gear 27.

For example, an origin position detection sensor 29 is mounted in relation to the operating surface of the cam 25A, to detect the origin of the rotation position of the cam 25A and stop the rotation of the stepper motor 28. An output from the sensor 29 is used to control a drive pulse power supply of the stepper motor 28. The stepper motor 28, the sensor 29, the drive pulse power supply, etc., are connected to and controlled by a motor controller (not shown).

FIG. 4 shows a state in which the cams 25A and 25B rotate to a position in which the cam rollers 24A and 24B are pushed out to the farthest position from the rotation axis 25A, and the pair of slide guide plates 2A and 2B is located in a position farthest away from each other. In contrast, FIG. 6 shows the case in which the pair of slide guide plates 2A and 2B approach closest to each other. In this case, the extension spring 23 is in its most compressed state. FIG. 6 shows a state in which the cams 25A and 25B rotate to a position in which the cam rollers 24A and 24B come to the closest position from the rotation axis 25A, and the pair of slide guide plates 2A and 2B is located in a position closest to each other.

Figure 6:
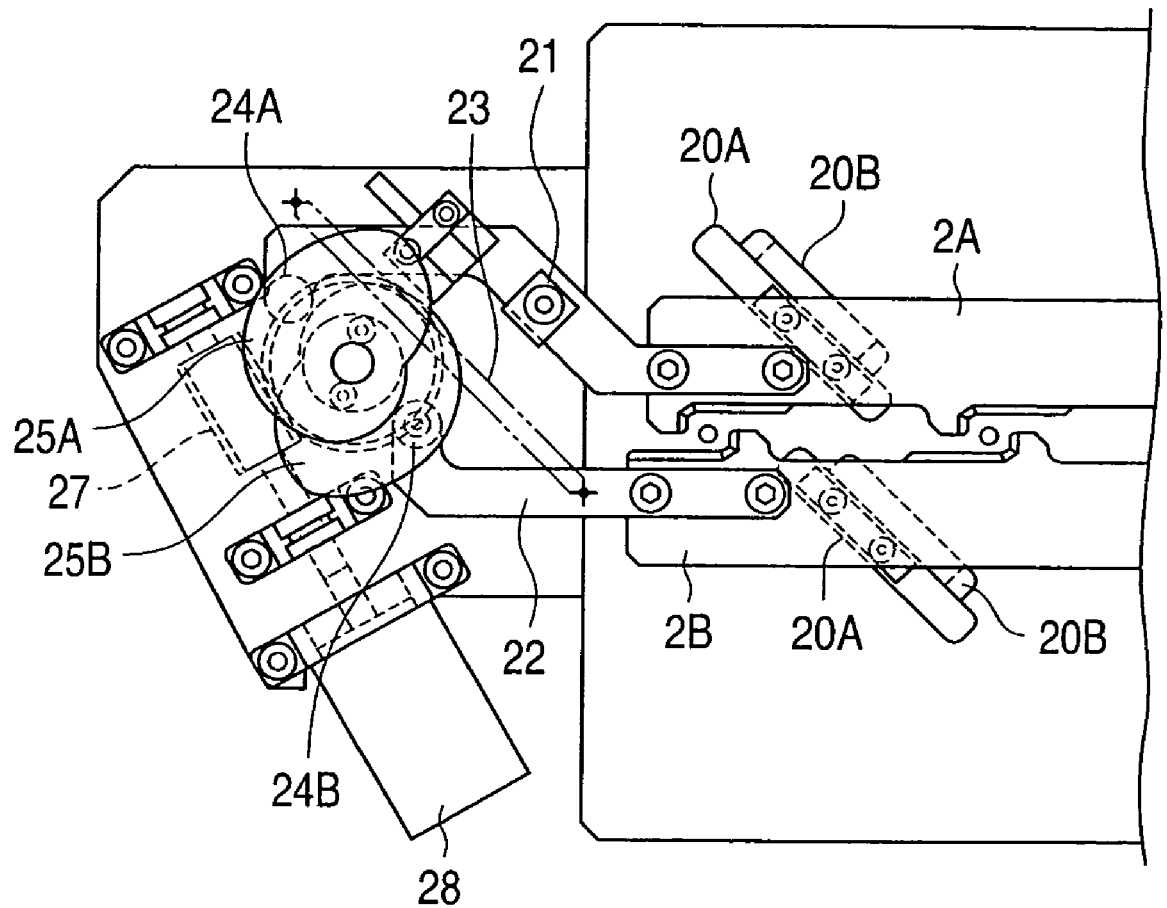
FIG. 6 is a plan view showing another example of an operating position of the IC device conveying apparatus according to the embodiment shown in FIG. 4.

In the embodiment shown in FIGS. 4 to 6, the rotation position of the stepper motor 28 is determined according to the number of pulses supplied to the stepper motor. Thus, the relative distance between the pair of slide guide plates 2A and 2B is determined.

In this manner, when the stepper motor 28 rotates, the operating arm 21 is operated by the cam 25A to move the slide guide plate 2A on the surface of the shuttle 1 in parallel in a direction, for example, approaching the slide guide plate 2B.

In this case, by controlling, by the motor controller, the number of pulses supplied to the stepper motor 28, the slide guide plate 2A moves to a position appropriate to the IC device size and an IC device holding side 2A4 formed on a side of the slide guide plate 2A can be held in a position in which a device holding space S is formed, without using a jig 11 or 12 in the embodiment shown in FIGS. 1 and 2. At the same time, other IC device holding sides 2A5 to 2A7 formed on the side of the slide guide plate 2A are also held in positions in which their corresponding device holding spaces S are formed.

Likewise, by the rotation of the stepper motor 28, the operating arm 22 is operated by the cam 25B to move the slide guide plate 2B on the surface of the shuttle 1 in parallel in a direction approaching the slide guide plate 2A. As a result, an IC device holding side 2B4 formed on a side of the slide guide plate 2B moves to a position corresponding to, for example, the position in which the IC device holding side 2B4 comes into contact with the jig 11 or 12 in the embodiment shown in FIGS. 1 and 2. As a result, first holding surfaces 16A and 16B of the respective IC device holding sides 2B4 to 2B7 formed on the side of the slide guide plate 2B stop in positions in which their corresponding device holding spaces S are formed.

In the configuration for the case of the embodiment shown in FIGS. 1 and 2, by employing the same configuration as that in FIG. 4, the IC device holding sides 3A4 to 3A7 and 3B4 to 3B7 formed on sides of the other pair of slide guide plates 3A and 3B similarly stop and are held in positions corresponding to the positions in which the IC device holding sides 3A4 to 3A7 and 3B4 to 3B7 come into contact with the jig 11 or 12 in the embodiment shown in FIGS. 1 and 2, without using jigs.

Here, in the embodiment shown in FIG. 1, the bolts 4A are used to hold the slide guide plate 2A in its stop position. On the other hand, in the embodiment shown in FIG. 4, instead of the operator tightening bolts, the slide guide plate 2A is held in the position by a combination of the wheel 26 and the worm gear 27. Furthermore, for example, though not shown, the configuration may be such that with a coil spring, which is formed longer in length than the thickness of the slide guide plate 2A, being slipped over a bolt 4A, the coil spring is pressed against the surface of the shuttle 1 by the head of the bolt 4A. As a result, a bias force is applied to the slide guide plate 2A by the coil spring in a direction away from the shuttle 1 and thus the slide guide plate 2A is held stably in that position. Other slide guide plates 2B, 3A, and 3B are also held in the same manner as above. As a result, IC devices are held stably between the slide guide plates 2A and 2B and between the slide guide plates 3A and 3B, without using the bolts 4A.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An IC device conveying apparatus comprising:
an IC device conveying shuttle;
at least a pair of slide guide plates which are placed on the IC device conveying shuttle, and each of which has a plurality of slide guide holes, each of said plurality of slide guide holes being made in a direction inclined to a side of a corresponding slide guide plate; and
a plurality of holding pins which hold the placed pair of slide guide plates such that the pair of slide guide plates slides in directions in which sides of the respective slide guide plates are separated from and come into contact with each other, the holding pins being secured to the IC device conveying shuttle and engaged with said plurality of slide guide holes,
wherein each of the pair of slide guide plates comprises at least one IC device holding side on a side thereof facing a side of another slide guide plate; and an IC device is placed in an IC device holding space which is formed between a pair of the IC device holding sides of the pair of slide guide plates on a top surface of the IC device conveying shuttle, and is held between the pair of the IC device holding sides.

2. The IC device conveying apparatus according to claim 1, wherein an insertion hole for an IC device holder is made in a middle of the IC device holding space on the top surface of the IC device conveying shuttle.

3. The IC device conveying apparatus according to claim 1, wherein an operating arm is secured to each of the pair of slide guide plates, to move the pair of slide guide plates in directions in which the slide guide plates are separated from and come into contact with each other along said plurality of holding pins.

4. The IC device conveying apparatus according to claim 1, further comprising:
a cam apparatus which drives the operating arms; and
a stepper motor which drives the cam apparatus.

* * * * *